US006898778B2

(12) United States Patent
Kawanaka

(10) Patent No.: US 6,898,778 B2
(45) Date of Patent: May 24, 2005

(54) SEMICONDUCTOR INTEGRATED CIRCUIT AND METHOD OF MANUFACTURING THE SAME

(75) Inventor: Shigeru Kawanaka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 31 days.

(21) Appl. No.: 10/400,566

(22) Filed: Mar. 28, 2003

(65) Prior Publication Data

US 2003/0162356 A1 Aug. 28, 2003

Related U.S. Application Data

(62) Division of application No. 09/902,700, filed on Jul. 12, 2001, now Pat. No. 6,576,956.

(30) Foreign Application Priority Data

Jul. 13, 2000 (JP) ........................................ 2000-212687

(51) Int. Cl.[7] .............................................. G06F 17/50
(52) U.S. Cl. ............................................. 716/18; 716/1
(58) Field of Search ....................... 716/18, 1; 257/347, 257/350

(56) References Cited

U.S. PATENT DOCUMENTS

| 4,191,898 | A | | 3/1980 | Ulmer |
| 5,223,733 | A | * | 6/1993 | Doi et al. ................... 257/386 |
| 5,495,419 | A | * | 2/1996 | Rostoker et al. ............. 700/121 |
| 5,544,066 | A | * | 8/1996 | Rostoker et al. .............. 716/18 |
| 5,698,869 | A | | 12/1997 | Yoshimi et al. |
| 5,936,436 | A | | 8/1999 | Kuroda |
| 5,973,364 | A | | 10/1999 | Kawanaka |
| 6,026,220 | A | * | 2/2000 | Cleereman et al. ........... 703/23 |

* cited by examiner

Primary Examiner—Vuthe Siek
Assistant Examiner—Sun James Lin
(74) Attorney, Agent, or Firm—Oblon, Spivak, McClelland, Maier & Neustadt, P.C.

(57) ABSTRACT

A multi-input logic circuit (e.g. a 2-input NAND circuit) mounted on a semiconductor integrated circuit comprises a plurality of voltage-activated transistors which have the same channel conduction type and are electrically connected in series between a power supply terminal and an output terminal. A source region and a body region of at least the voltage-activated transistor connected to the output terminal are electrically connected and have substantially the same potential. The semiconductor integrated circuit has either an SOI or SOS structure.

2 Claims, 14 Drawing Sheets

RELATED ART

SEMICONDUCTOR INTEGRATED CIRCUIT AND METHOD OF MANUFACTURING THE SAME

CROSS-REFERENCE TO RELATED APPLICATION

This application is a Division of application Ser. No. 09/902,700 filed on Jul. 12, 2001 now U.S. Pat. No. 6,576,956.

This application claims benefit of priority under 35 U.S.C. §119 to Japanese Patent Application No. 2000-212687, filed on Jul. 13, 2000, the entire contents of which is incorporated by reference herein.

BACKGROUND OF THE INVENTION

1. Filed of the Invention

The present invention relates to a semiconductor integrated circuit and a method of manufacturing the same, and more particularly to a semiconductor integrated circuit including a multi-input logic circuit constituted by a plurality of voltage-activated transistors which are connected in series, and a method of manufacturing such a semiconductor integrated circuit.

2. Description of the Related Art

Generally, a multi-input logic circuit such as a NAND or NOR circuit comprises a plurality of n-channel and p-channel MOSFETs (metal oxide semiconductor field effect transistors) which are electrically connected in series between a power supply terminal and a grounding terminal. Referring to FIG. 16 of the accompanying drawings, a 2-input NAND circuit comprises n-channel MOSFETs 100 and 101 electrically connected in series between a grounding power supply terminal Vss and a signal output terminal Pout, and p-channel MOSFETs 102 and 103 electrically connected in parallel between a circuit operation voltage terminal Vcc and the signal output terminal Pout. Gate electrodes of the n-channel MOSFET 100 and p-channel MOSFET 102 are electrically connected to a signal input terminal Pin2 while gate electrodes of the n-channel MOSFET 101 and p-channel MOSFET 103 are connected to a signal input terminal Pin1.

When this 2-input NAND circuit is constituted by a bulk-type element in which the n-channel MOSFETs 100, 101 and the p-channel MOSFETs 102, 103 are formed on a main surface of a silicon single crystal substrate, a threshold voltage is increased in the n-channel MOSFET 101 at the output terminal Pout due to a body effect. The increase of the threshold voltage adversely affects the current-activated performance of the 2-input NAND circuit, and lowers the overall operation speed of the semiconductor integrated circuit.

The use of the SOI (silicon on insulator) or SOS (silicon on sapphire) structure is effective in reducing the body effect in the semiconductor integrated circuit. In the SOI structure, an SOI substrate includes a silicon single crystal layer which is formed on a silicon single crystal substrate via an insulator, and elements are mounted on the silicon single crystal layer. With the SOS structure, an SOS substrate is provided with a silicon single crystal layer which is formed on a sapphire substrate, and elements are mounted on the silicon single crystal layer. In either structure, the elements are isolated, and potentials of body regions depend upon a built-in potential between the body region and a source region. Therefore, it has been expected that the increase of the threshold voltage due to the body effect can be prevented in the n-channel MOSFET 101 of the 2-input NAND circuit.

However, the logic circuit including the foregoing SOI elements suffers from variations of element characteristics due to a varying body potential (substrate bias effect), and a reduced noise margin. As a result, each SOI element needs a body contact. If the body contacts are provided for the SOI elements in a structure identical to that of existing bulk-type elements, it is not possible to reduce the body effect. As a result, the operation speed of the semiconductor integrated circuit will be lowered.

SUMMARY OF THE INVENTION

According to a first feature of the invention, there is provided a semiconductor integrated circuit comprising: a substrate having an insulator at least on a surface thereof; a semiconductor layer on the insulator; and at least first and second of voltage-activated transistors having the same channel conduction type, electrically connected between a power supply terminal and an output terminal in the semiconductor layer and having a body region which is electrically isolated; wherein a source region and the body region of at least the first or second voltage-activated transistor connected to the output terminal are electrically connected and have substantially the same potential.

In accordance with a second feature of the invention, there is provided a semiconductor integrated circuit comprising: a substrate having an insulator at least on a surface thereof; a semiconductor layer on the insulator; a first voltage-activated transistor including a source region connected to a power supply terminal and a body region and a drain region in the semiconductor layer; a second voltage-activated transistor which includes in the semiconductor layer, a source region which is integral with the drain region of the first voltage-activated transistor, a body region having the same conduction type as that of the body region of the first voltage-activated transistor and electrically isolated from the body region of the first voltage-activated transistor, a drain region electrically connected to an output terminal, and a body contact region which is integral with the body region of at least the second voltage-activated transistor, has the same conduction type as that of the body region of at least the second voltage-activated transistor, has an impurity concentration higher than that of the body region, and is positioned along the gate width; and a wiring electrically connecting the source region and the body contact region of the second voltage-activated transistor, extending from the source region along the gate width and bent in the shape of L along the gate length.

With a third feature of the invention, there is provided a semiconductor integrated circuit comprising: a substrate having an insulator at least on a surface thereof; a semiconductor layer on the insulator; a plurality of first voltage-activated transistors having the same channel conduction type, electrically connected in parallel or in series between a first power supply terminal and an output terminal in the semiconductor layer and having body regions which are electrically isolated; and a plurality of second voltage-activated transistors having the same channel conduction type, electrically connected in series or in parallel to a second power supply terminal and the output terminal in the semiconductor layer and having body regions which are electrically isolated, wherein a source region and the body region of at least the first or second voltage-activated transistor connected in series to the output terminal are electrically connected and have substantially the same potential.

According to a fourth feature of the invention, there is provided a semiconductor integrated circuit comprising: a substrate having an insulator at least on a surface thereof; a semiconductor layer on the insulator; a first voltage-activated transistor which has a first source region, a first body region and a first drain region in the semiconductor layer; a second voltage-activated transistor which has a second source or drain region integral with the first source or drain region, a second body region having the same channel conduction type as that of the first body region and electrically isolated therefrom, and a second drain or source region, the second voltage-activated transistor arranged along the gate length of the first voltage-activated transistor, in the semiconductor layer; a first body contact region which has the same conduction type as that of the second body region, is integral with the second body region in the semiconductor layer, has an impurity concentration higher than that of the second body region, the first body contact region positioned along the gate width; a first wiring electrically connecting a second source region and the first body contact region of the second voltage-activated transistor, extending from the second source region along the gate width and bent in the shape of L toward the first body contact region along the gate length; a third voltage-activated transistor including a third source region, a third body region which has a conduction type opposite to those of the first and second body regions, and a third drain region, in the semiconductor layer, the third voltage-activated transistor being axi-symmetrical to the first voltage-activated transistor along the gate width of the first voltage-activated transistor; a fourth voltage-activated transistor including a fourth source or drain region integral with the third source or drain region, a fourth body region having the same conduction type as that of the third body region and electrically isolated therefrom, and a fourth drain or source region, in the semiconductor layer, the fourth voltage-activated transistor positioned along the gate length of the third voltage-activated transistor; a second body contact region which has the conduction type same as that of the fourth body region, is integral with the fourth body region in the semiconductor layer, and has an impurity concentration higher than that of the fourth body region, the second body contact region positioned along the gate width and being axi-symmetrical to the first body contact region; and a second wiring electrically connecting a fourth source region and the second body contact region of the fourth voltage-activated transistor, extending from the fourth source region along the gate width and bent in the shape of L toward the second body contact region along the gate length.

According to a fifth feature of the invention, a semiconductor integrated circuit comprises: a substrate having an insulator at least on a surface thereof; a semiconductor layer on the insulator; and at least first and second voltage-activated transistors which are electrically connected in series between a first power supply terminal and a second power supply terminal, of which potential is higher than that of the first power supply terminal, in the semiconductor layer and include electrically isolated body regions, wherein a source region and a body region of at least the first or second voltage-activated transistor near the second power supply terminal are electrically connected and have substantially the same potential.

With a sixth feature of the invention, a method of manufacturing a semiconductor integrated circuit comprises: forming a plurality of voltage-activated transistors in a semiconductor layer on a substrate having an insulator at least on a surface thereof, the voltage-activated transistors including body contact regions electrically connecting a body region and a source region and having the same channel conduction type; and electrically connecting the voltage-activated transistors in series to a power supply terminal and an output terminal, and a source region and the body contact region of at least the voltage-activated transistor near the output terminal.

Finally, a seventh feature of the invention, a method of manufacturing a semiconductor integrated circuit comprising: storing a cell library in a database, the cell library containing data of at least a plurality of voltage-activated transistors electrically connected in series and in which a body region and a source region of at least the voltage-activated transistor near an output terminal are electrically connected and have the same potential; designing a logic circuit; locating the cell library from the database to a memory space on the basis of the logic circuit by using a design automation system; linking the cell library in the memory space using the design automation system and creating logic circuit data; making a manufacturing mask on the basis of the logic circuit data created by the design automation system; and forming a logic circuit in a semiconductor layer on a substrate having an insulator at least on a surface thereof and manufacturing a semiconductor integrated circuit.

DESCRIPTION OF THE PREFERRED EMBODIMENTS

Figure 1:
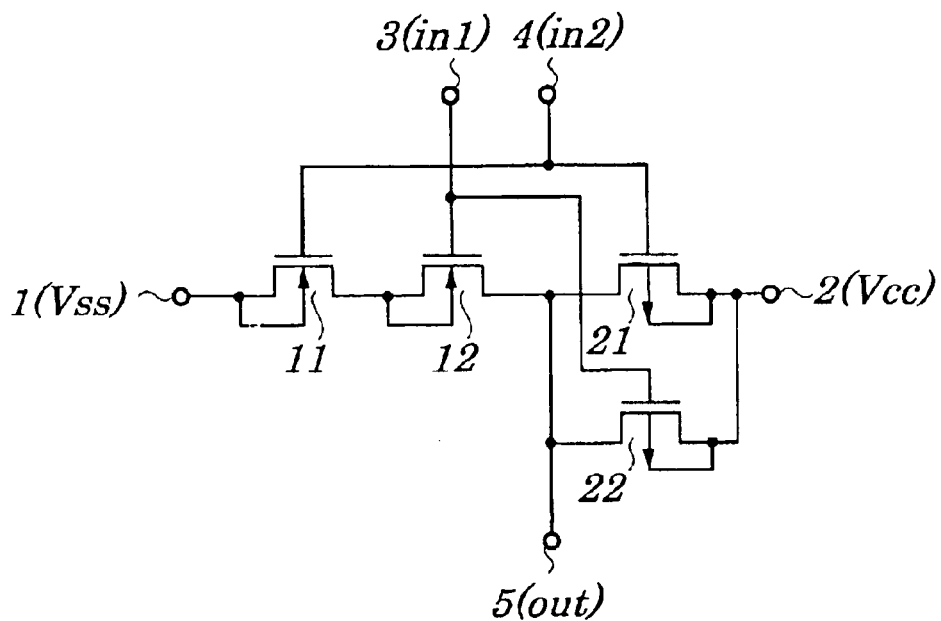
FIG. 1 shows a 2-input NAND circuit mounted in a semiconductor integrated circuit according to a first embodiment of the invention.

The invention will be described with reference to embodiments shown in the drawings. Like or corresponding parts are denoted by like or corresponding reference numerals. Since the drawing figures are schematic, it should be noted that dimensional relationships shown in them are not always the same as those of the actual products.

(First Embodiment of the Invention)

In a first embodiment, a 2-input NAND circuit is used as a multi-input logic circuit to be mounted in a semiconductor integrated circuit.

[Circuit Configuration of 2-Input NAND Circuit]

Referring to FIG. 1, the 2-input NAND circuit comprises: voltage-activated transistors 11 and 12 which are of the same channel conduction type and are electrically connected between a first power supply terminal 1 and an output terminal 5 (out); voltage-activated transistors 21 and 22 which are of the same channel conduction type and are electrically connected between a second power supply terminal 2 and the output terminal 5 (out). A source region (a first main electrode region) and a body region (channel forming region) of at least the voltage-activated transistor 12 near the output terminal 5 are electrically connected so as to have substantially the same potential.

The first power supply terminal 1 supplies a circuit grounding potential Vss, e.g. 0 V, while the second power supply terminal 2 supplies a circuit operating potential Vcc, e.g. 1.0 V to 3.3 V.

The voltage-activated transistors (called the "transistors" hereinafter) 11 and 12 are constituted by n-channel IGFETs (insulated gate field effect transistors), which include at least MOSFETs and MISFETs (metal insulated semiconductor field effect transistors). The transistor 11 has a source region electrically connected to the first power supply terminal 1, and a drain region (a second main electrode region) electrically connected to the source region of the transistor 12. A gate electrode (a control electrode) is electrically connected to a second input terminal 4 (in2). The transistor 12 has a drain region electrically connected to the output terminal 5, and a gate electrode electrically connected to a first input terminal 3 (in1). The same or different logic signals are inputted into the first and second input terminals 3 and 4, respectively.

The transistors 21 and 22 are constituted by p-channel IGFETs, which include at least MOSFETs and MISFETs, similarly to the transistors 11 and 12. The transistor 21 has a source region electrically connected to the second power supply terminal 2, a drain region electrically connected to the output terminal 5 (and to the drain region of the transistor 12), and a gate electrode electrically connected to the second input terminal 4. The transistor 22 has a source region electrically connected to the second power supply terminal 2, a drain region electrically connected to the output terminal 5 (and to the drain region of the transistor 12), and a gate electrode electrically connected to the first input terminal 3.

The source region and the body region of at least the transistor 12 are connected (short-circuited) so as to have the same potential. In this embodiment, the source regions and body regions of the transistors 11, 21 and 22 are electrically connected so as to have the same potential. Specifically, the source regions and the body regions are electrically connected only via essential components such as parasitic resistors, schottky junctions and so on, but without via resistance elements or diode elements.

In the foregoing semiconductor integrated circuit, the source region and the body region of at least the transistor 12 near the output terminal 5 side are electrically connected, so that the potential at the body region is maintained to be the same as that of the source region. Therefore, it is possible not only to suppress the substrate bias effect but also to prevent the increase of the threshold voltage due to the body effect.

Figure 2:
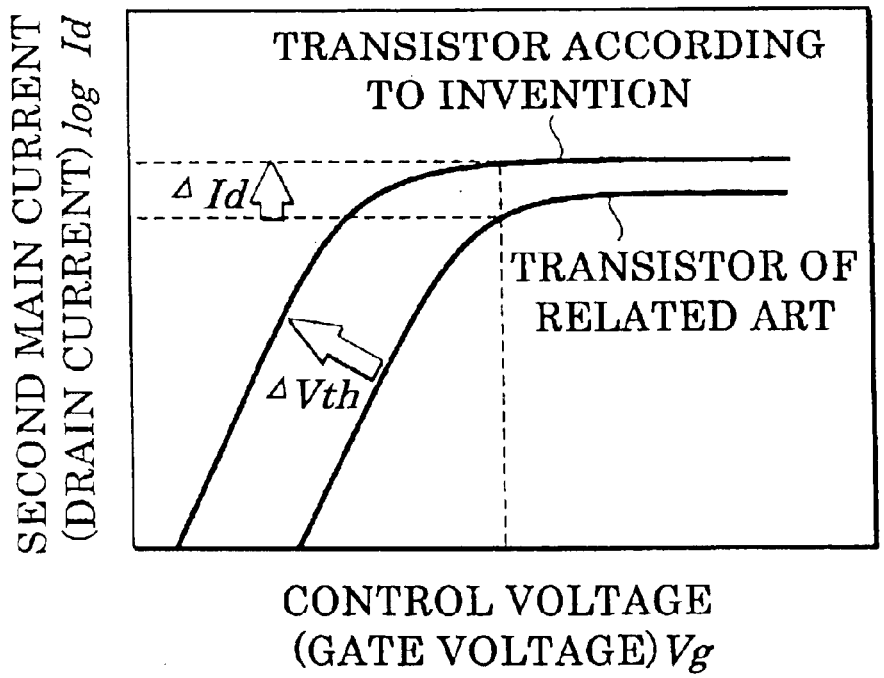
FIG. 2 shows the relationship between a gate voltage and a drain current in a voltage-activated transistor of the 2-input NAND circuit.

As shown in FIG. 2, a threshold voltage Vth of the transistor 12 can be lowered to an ideal value, and a drain current (a second main current) Id can be increased in accordance with a gate voltage (a control voltage) Vg. This is effective in improving the current-activated performance of the transistor 12, and reducing the power consumption of the semiconductor integrated circuit. Further, it is possible to increase the drain current Id of the transistor 12, which is effective in accelerating the operation of the transistor 12 and the semiconductor integrated circuit.

The 2-input NAND circuit constituted by the transistors 11, 12, 21 and 22 can improve its operation performance and accelerate the operation of the semiconductor integrated circuit.

[Device Structure of 2-Input NAND Circuit]

The following describe the structures of the semiconductor integrated circuit and the 2-input NAND circuit mounted thereon.

The semiconductor integrated circuit adopts the SOI structure as shown in FIG. 3 to FIG. 6. A base 30 of the semiconductor integrated circuit includes a silicon single crystal substrate 30A having an insulator 30B at least on a surface thereof, and a silicon single crystal layer (a semiconductor layer or an element forming layer) 30C on the insulator 30B. The silicon single crystal substrate 30A is preferably made of a p-type silicon single crystal wafer which has a resistance value of 1 Ωcm to 10 Ωcm, or an impurity concentration of approximately $10^{15}$ atoms/cm$^3$ to $10^{16}$ atoms/cm$^3$. The insulator 30B is preferably a silicon oxide film (SiO$_2$) having a thickness of approximately 100 nm to 400 nm. The silicon single crystal layer 30C is approximately 100 nm to 180 nm thick, for example. The base 30 is prepared by a bonding or SIMOX (separation by implantation of oxygen) process. In the case of the bonding process, the silicon single crystal layer 30C is bonded onto the silicon single crystal substrate 30A via the insulator (e.g. SiO$_2$ film) 30B. In the SIMOX process, oxide (O$_2$) is introduced into a bulk of the surface of the silicon single crystal substrate 30A by implanting high energy ion implantation in order to form the insulator 30B. A part of the surface of the silicon single crystal substrate 30A on the insulator 30B is used as the silicon single crystal layer 30C.

In the silicon single crystal layer 30C, an element isolating insulator 31 is provided between elements, and may be a silicon oxide films which is formed by oxidation of the silicon single crystal layer 30C, or may be an insulator (e.g. silicon oxide film) embedded in a trench formed in the silicon single crystal layer 30C between the transistors.

In the 2-input NAND circuit shown in FIG. 1, the transistor 11 is mounted on the silicon single crystal layer 30C in an area surrounded by the element isolating insulator 31 as shown in FIG. 3, FIG. 4, FIG. 6 and FIG. 7. The transistor 11 comprises at least a p-type body region 32, an gate-insulated film 34 on the p-type body region 32, the gate electrode 35 on the gate-insulated film 34, and the source region 36 and the drain region 36 provided on the silicon single crystal layer 30C.

The body region 32 has an impurity concentration of approximately $10^{17}$ atoms/cm$^3$. The gate-insulated film 34 is constituted by a silicon oxide film, a silicon nitride film, an oxy-nitride film or the like, or composite layers of these films, and is approximately 1.5 nm to 3.0 nm thick when calculated in terms of the silicon oxide film. The gate electrode 35 is made of a silicon polycrystalline film, for example, and is approximately 100 nm to 150 nm thick. The transistors 11, 12, 21 and 22 have a salicide structure. In each of these transistors, a silicide layer 38A is provided on the gate electrode 35 (see FIG. 3 and FIG. 4), and is a cobalt silicide film (CoSi$_2$), for example, which is approximately 50 nm to 100 nm thick. The source and drain regions 36 have the LDD (lightly doped drain) structure, and include an n-type semiconductor region having a low impurity concentration of approximately $10^{19}$ atoms/cm$^3$ and an n-type semiconductor region having a high impurity concentration of approximately $10^{20}$ atoms/cm$^3$. The n-type semiconductor regions of the low impurity concentration are located near the body region 32. Silicide layers 38B, e.g. cobalt silicide films, are provided on the source and drain regions 36 in order to form the salicide structure. The gate electrode 35 has side-wall spacers (no reference numeral assigned thereto), which have the LDD structure and also serve as a mask for forming the salicide structure.

Figure 6:
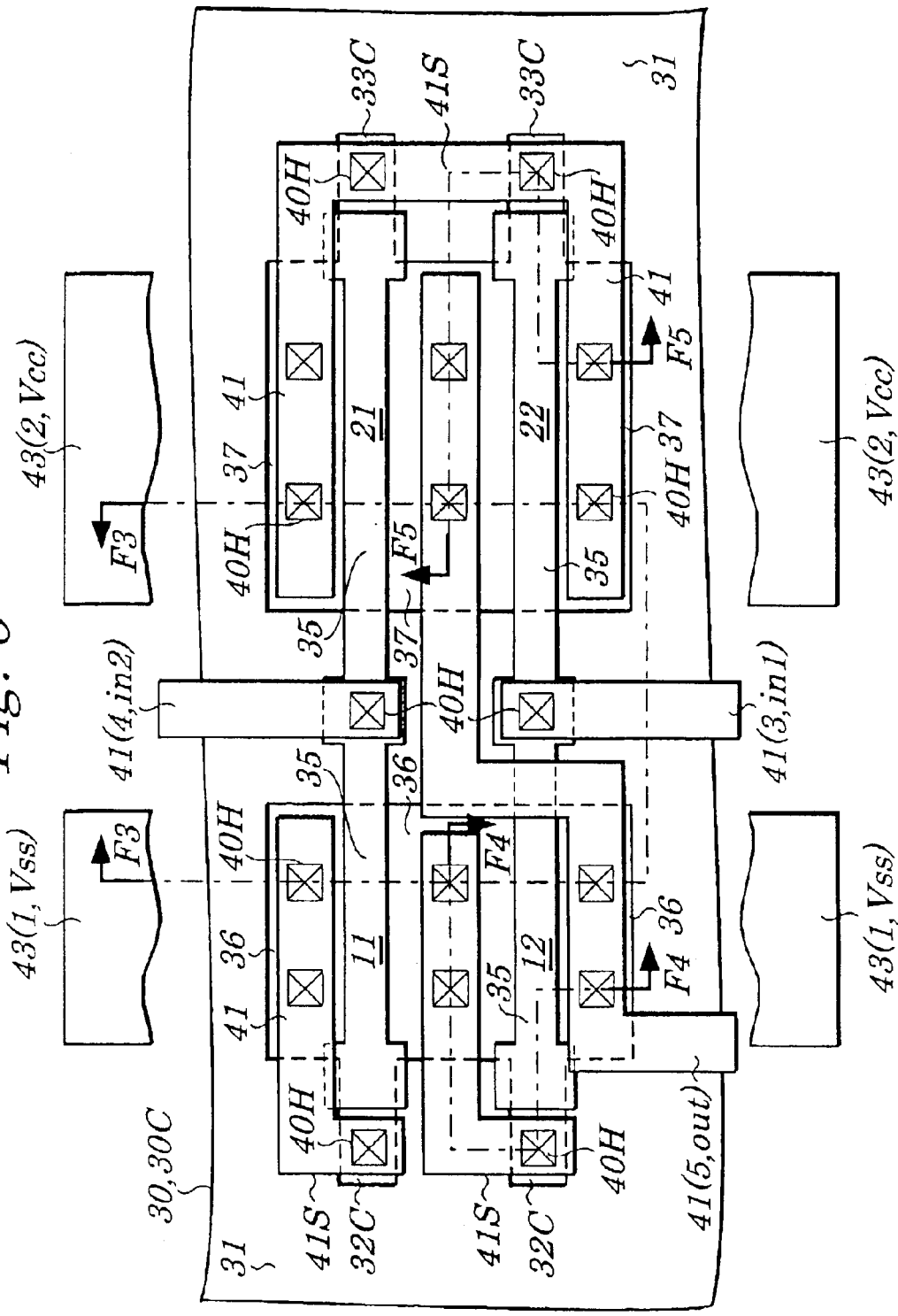
FIG. 6 is a top plan view of the essential part of the semiconductor integrated circuit.

A first wiring (a first layer wiring) 41 is electrically connected via the silicide layer 38B to the source and drain regions 36 of the transistor 11. This first wiring 41 is provided on an inter-layer insulator film 40 extending over elements of the transistors 11 and so on, and is connected to the source and drain regions 36 via a connection hole (or a through hole, a contact hole, a via hole and so on) 40H in the inter-layer insulator film 40. The first wiring 41 is mainly made of an aluminum film, an aluminum alloy film containing predetermined additives (Al—Si, Al—Cu, Al—Cu—Si and so on), a copper film or the like. Alternatively, the first wiring 41 may be made of a composite film including a barrier metal film, an anti-reflection film and so on. This also applies to a second wiring (a second layer wiring) 43 to be described later. The inter-layer insulator film 40 may be a single layer mainly made of a silicon oxide film, or a composite film. Referring to FIG. 6, the first wiring 41 is also electrically connected via the silicide layer 38A to the gate electrode 35 of the transistor 11.

Figure 4:
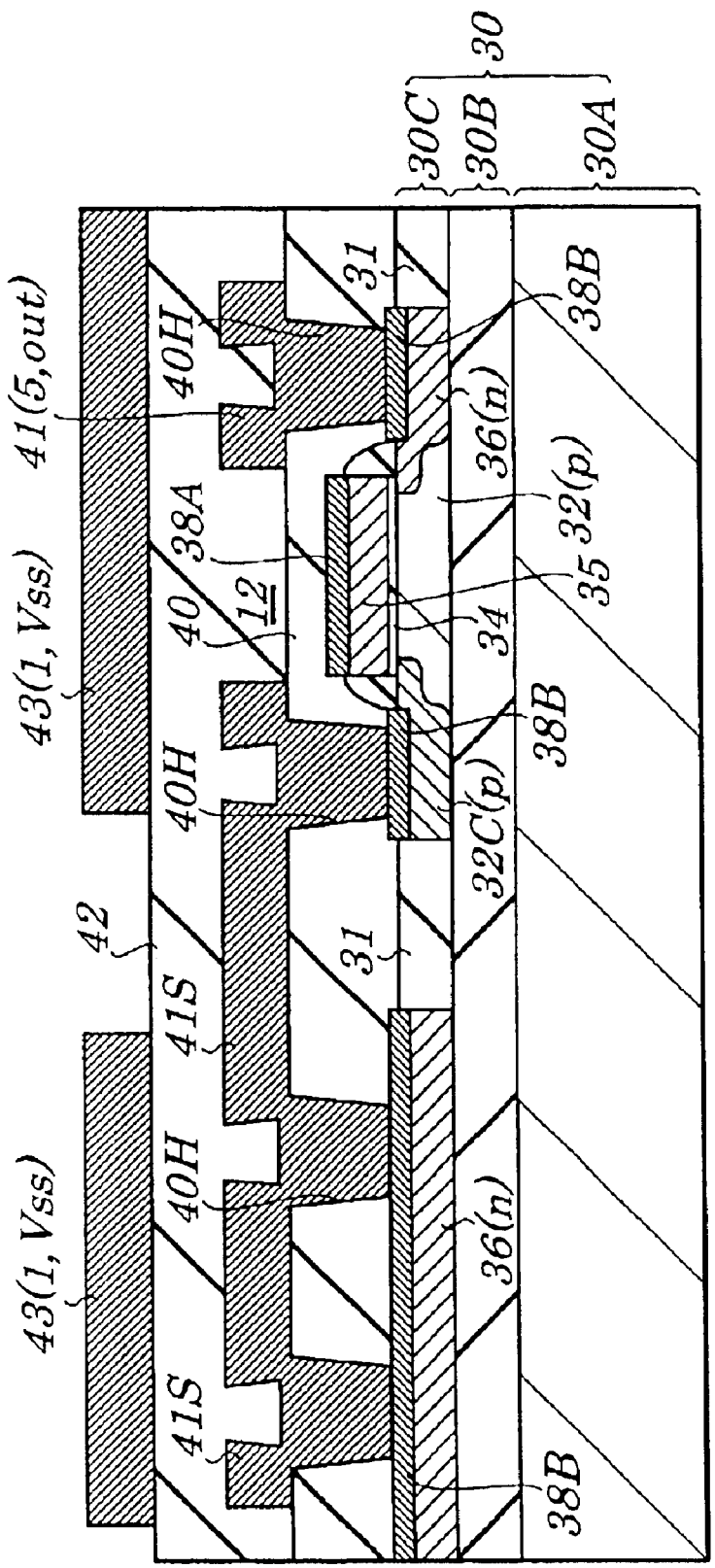
FIG. 4 is a cross section of an essential parts of the semiconductor integrated circuit of FIG. 1, taken along line F4—F4 in FIG. 6.
Figure 7:
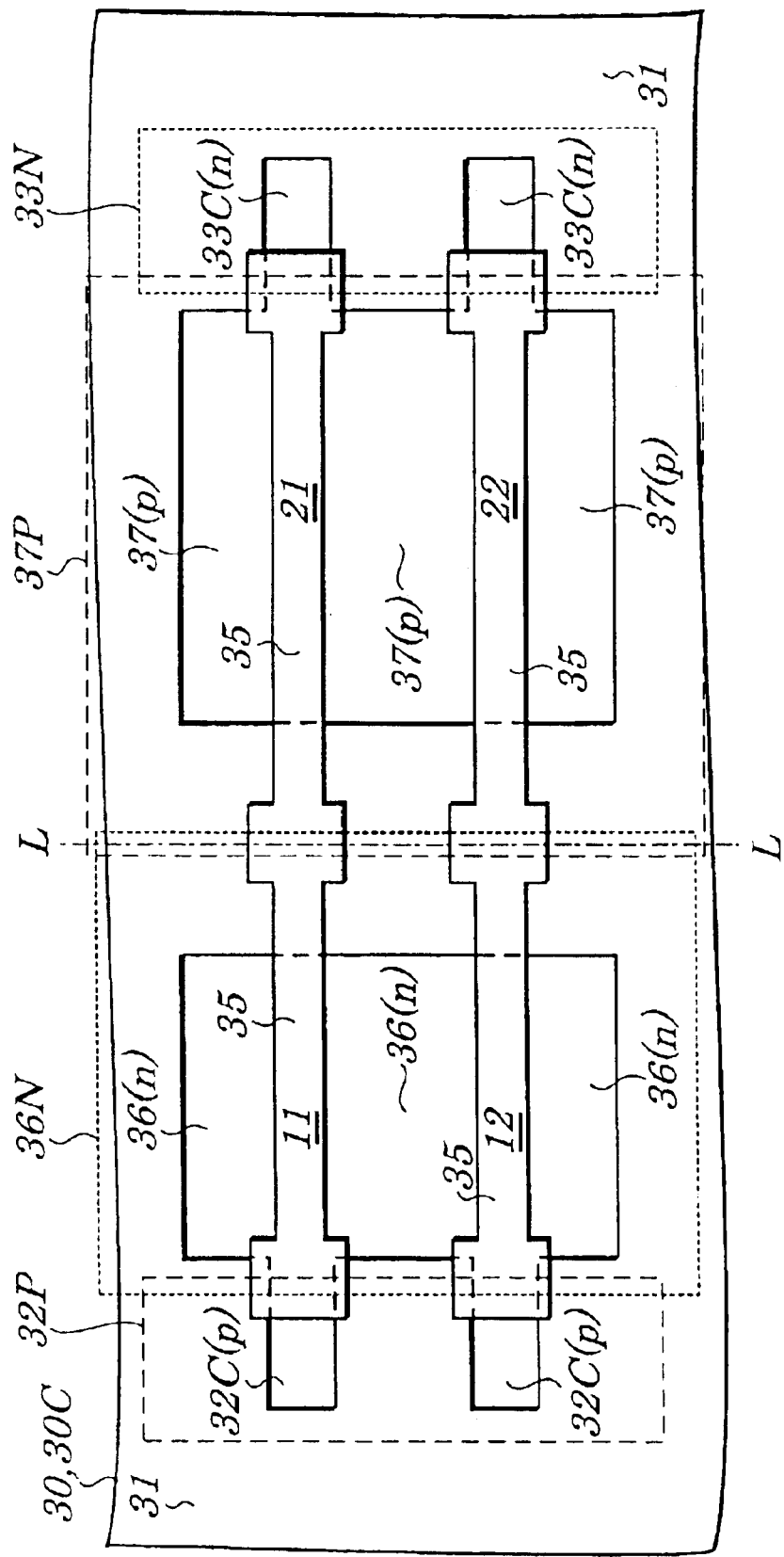
FIG. 7 is a top plan view showing only the shape of elements of the semiconductor integrated circuit.

Referring to FIG. 4, FIG. 6 and FIG. 7, in the silicon single crystal layer 30C, the transistor 11 is provided with a body contact region 32C which is positioned near one side edge of the body region 32 along the gate width or the channel width (i.e. extends to the left in FIG. 6 and FIG. 7), and is electrically connected to the body region 32. In other words, the body contact region 32C is positioned opposite to the transistor 21 with the transistor 11 positioned at the center. The body contact region 32C is made of a p-type semiconductor region which has the same channel conduction type as that of the body region 32, and has a high impurity concentration in order to reduce contact resistance. It is preferable that the body contact region 32C be formed by the same process, i.e. the ion implantation process, for the source and drain regions 37 of the transistors 21 and 22 in order to reduce the number of steps for manufacturing the semiconductor integrated circuit. Further, the source region 36 and the body contact region 32C of the transistor 11 are electrically connected by a first wiring 41S which has the same conduction layer as that of the first wiring 41 (and is formed in the same manufacturing step), so that the source region 36 and the body region 32 have the same potential.

The first wiring (first layer wiring) 41S extends from the source region 36 along the gate width of the transistor 11, and is bent in the shape of L toward the body contact region 32C along the gate length.

Figure 3:
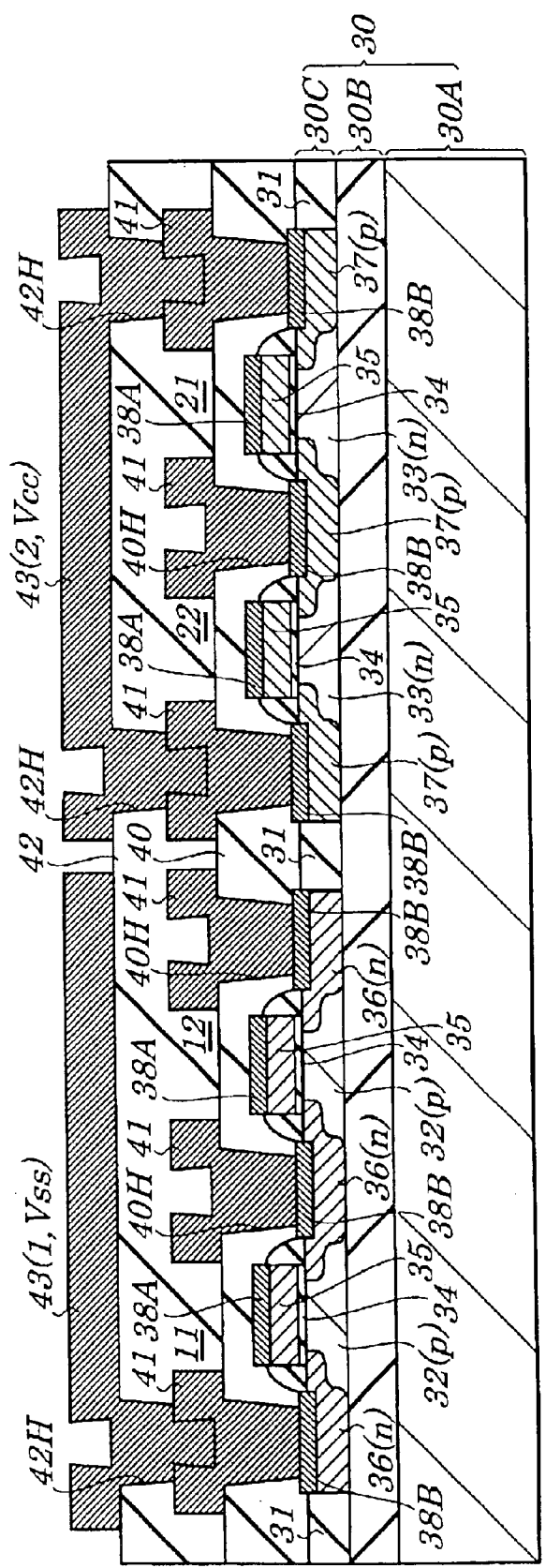
FIG. 3 is a cross section of essential parts of the semiconductor integrated circuit of FIG. 1, taken along line F3—F3 in FIG. 6.

A second wiring 43 is provided on an inter-layer insulator film 42 as shown in FIG. 3, and is electrically connected to the first wiring 41 via a connection hole (or through hole, via hole and so on) 42H formed in the inter-layer insulator film 42. The second wiring 43 is identical to the first wiring 41. Further, the inter-layer insulator film 42 is identical to the inter-layer insulator film 40.

The transistor 12 is provided on the silicon single crystal layer 30C in an area surrounded by the element isolating insulator 31 as shown in FIG. 3, FIG. 4, FIG. 6 and FIG. 7, similarly to the transistor 11. In other words, the transistor 12 comprises at least a p-type body region 32, a gate-insulated film 34 on the body region 32, a gate electrode 35 on the gate-insulated film 34, and the source region 36 and the drain region 36 provided on the silicon single crystal layer 30C.

The body regions 32 of the transistors 12 and 11 are electrically isolated because of the SOI structure. Referring to FIG. 4, FIG. 6 and FIG. 7, in the silicon single crystal layer 30C, the transistor 12 is provided with a body contact region 32C which is positioned near one side edge of the body regions 32 along the gate width or the channel width (i.e. extends to the left in FIG. 6 and FIG. 7), and is electrically connected to the body region 32. This feature is similar to that of the transistor 11.

The source regions 36 of the transistors 12 and the drain regions 36 of the transistors 11 are electrically connected without via the element isolating insulator 31, and are integral. Especially, the transistor 12 is positioned (vertically in FIG. 7) along the gate length of the transistor 11. The gate length of transistor 11 agrees with gate length of transistor 12. In other words, the element isolating insulator 31 surrounds the body region 32, the body contact region 32C, the source and drain regions 36 of the transistor 11, and the body region 32, the body contact region 32C, the source and drain regions 36 of the transistor 12, all of which constitute one active region.

The transistor 12 has the LDD structure and the salicide structure similarly to the transistor 11. A silicide layer 38A is on the gate electrode 35, and a suicide layer 38B is on the source and drain regions 36. In the 2-input NAND circuit, the source region 36 and the body region 32 of at least the transistor 12 are electrically connected via the first wiring 41S and the body contact region (p-type semiconductor region) 32C, so that the source region 36 and the body region 32 have the same potential.

The first wiring 41S of the transistor 12 extends from the source region 36 along the gate width, and is bent in the shape of L toward the body contact region 32C along the gate length.

On the transistors 11 and 12, the second wiring 43 on the first wiring 41 and 41S (in the shaped of L) is used to provide a first power wiring (Vss). The line width of the first power wiring is a degree equal to the gate width of the transistors 11 and 12, and extends along the gate length.

Referring to FIG. 3 and FIG. 5 to FIG. 7, the transistor 21 is mounted on the silicon single crystal layer 30C at an area surrounded by the element isolating insulator 31, and comprises at least an n-type body region 33, a gate-insulated film 34 on the body region 33, a gate electrode 35 on the gate-insulated film 34, and a source region 37 and a drain region 37 provided on the silicon single crystal layer 30C.

The body region 33 has an impurity concentration of approximately $10^{17}$ atoms/cm$^3$ (for example), similarly to the body regions 32 of the transistors 11 and 12. The body region 33 of the transistor 21 is electrically isolated from the body regions 32 of the transistors 11 and 12 because of the SOI structure. The gate-insulated film 34 and gate electrode 35 are identical to those of the transistors 11 and 12 and manufactured by the same process. A silicide layer 38A is provided on the gate electrode 35. The source and drain regions 37 have the LDD structure, and include a p-type semiconductor region having a low impurity concentration of approximately $10^{19}$ atoms/cm$^3$ and a p-type semiconductor region having a high impurity concentration of approximately $10^{20}$ atoms/cm$^3$. The p-type semiconductor regions of the low impurity concentration are located near the body region 33. Silicide layers 38B are provided on the source and drain regions 37.

The first wiring 41 is provided on the inter-layer insulator film 40, and is electrically connected to the source and drain regions 37 of the transistor 21 via the silicide layers 38B and the connection hole 40H in the inter-layer insulator film 40. Further, the second wiring 43 is provided on the inter-layer insulator film 42 and is electrically connected to the first wiring 41 via the connection hole 42H in the inter-layer insulator film 42.

Figure 5:
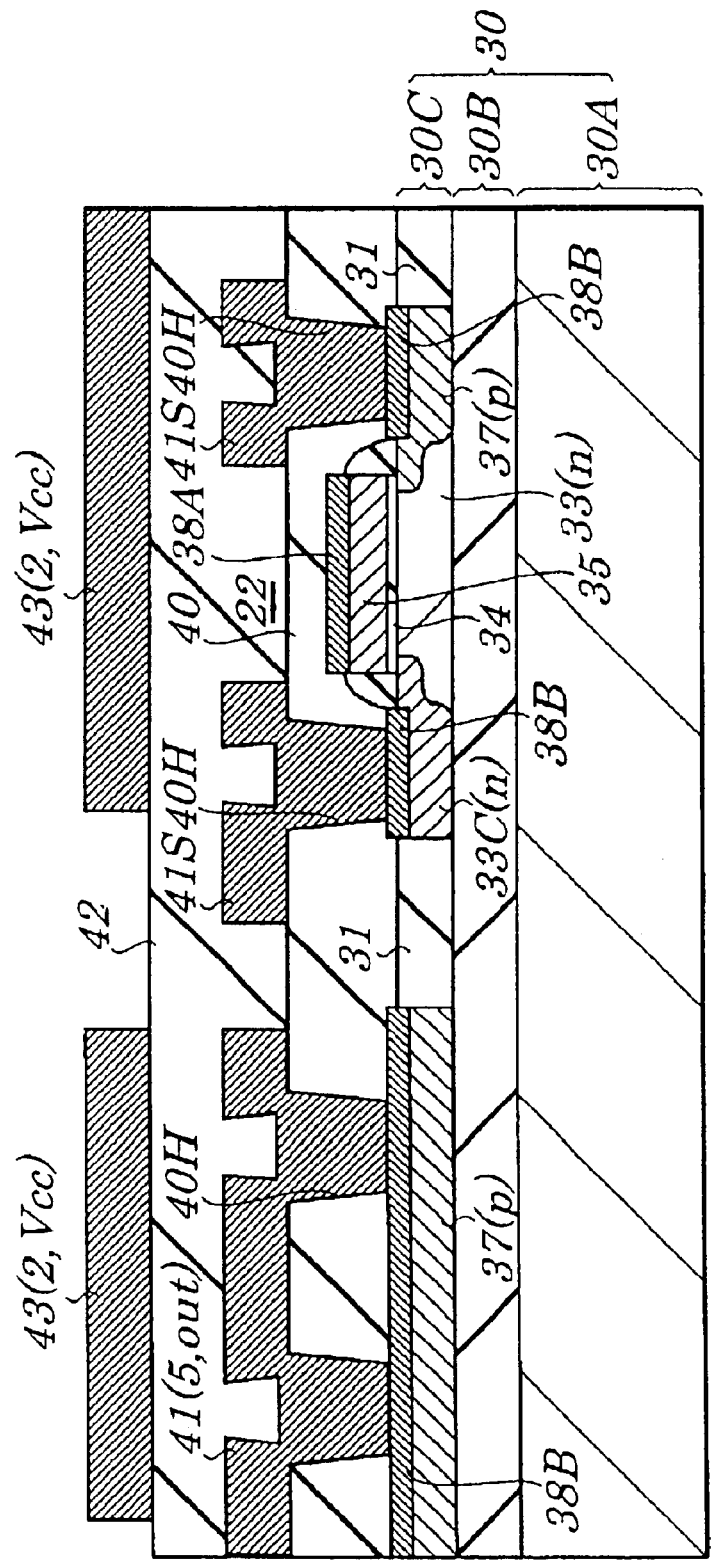
FIG. 5 is a cross section of the essential parts of the semiconductor integrated circuit of FIG. 1, taken along line F5—F5 in FIG. 6.

Referring to FIG. 5, FIG. 6 and FIG. 7, in the silicon single crystal layer 30C, the transistor 21 is provided with a body contact region 33C which is positioned near one side edge of the body region 33 along the gate width or channel width (i.e. extends to the right in FIG. 6 and FIG. 7), and is electrically connected to the body region 33. In other words, the body contact region 33C is positioned opposite to the transistor 11 with the transistor 21 positioned at the center.

The body contact region 33C is made of an n-type semiconductor region which has the same conduction type as that of the body region 33, and has a high impurity concentration in order to reduce the contact resistance. It is preferable that the body contact region 33C be formed by the same process (i.e. the ion implantation process) for the source and drain regions 36 of the transistors 11 and 12 in order to reduce the number of steps for manufacturing the semiconductor integrated circuit. Further, the source region 37 and the body contact region 33C of the transistor 21 are electrically connected by a first wiring 41S which has the same conductive layer as that of the first wiring 41 (and is formed in the same manufacturing step), so that the source region 37 and the body region 33 have the same potential.

The first wiring 41S of the transistor 21 extends from the source region 37 along the gate width, and is bent in the shape of L toward the body contact region 33C along the gate length. This first wiring 41S is similar to the first wirings 41S of the transistors 11 and 12.

Especially referring to FIG. 7, the transistor 21 is axisymmetrical to the transistor 11 with respect to a virtual center line L—L (The expedient center line which does not exist actually.) between the transistors 11 and 21 (i.e. along the gate width, or laterally in FIG. 7). Further, the transistor 21 is larger than the transistor 11 because of different degrees of the carrier mobility, but is substantially axisymmetrical to the transistor 11.

As shown in FIG. 3 and FIG. 5 to FIG. 7, the transistor 22 is provided on the silicon single crystal layer 30C in an area surrounded by the element isolating insulator 31, similarly to the transistor 21. The transistor 22 comprises at least a p-type body region 33, a gate-insulated film 34 on the body region 33, a gate electrode 35 on the gate-insulated film 34, and a source region 37 and a drain region 37 provided on the silicon single crystal layer 30C.

The body region 33 of the transistor 22 is electrically isolated from the body region 33 of the transistor 21 because of the SOI structure. Referring to FIG. 5 to FIG. 7, in the silicon single crystal layer 30C, the transistor 22 is provided with a body contact region 33C which is positioned near one side edge of the body region 33 along the gate width or channel width (i.e. extends to the right in FIG. 6 and FIG. 7), and is electrically connected to the body region 33.

The drain region 37 of the transistor 22 and the drain region 37 of the transistor 21 are electrically connected without via the element isolating insulator 31, and are integral. Especially, the transistor 22 is positioned (vertically in FIG. 7) along the gate length of the transistor 21. The gate length of transistor 21 agrees with gate length of transistor 22. In other words, the element isolating insulator 31 surrounds the body region 33, the body contact region 33C, the source and drain regions 37 of the transistor 21, the body region 33, the body contact region 33C, the source and drain regions 37 of the transistor 22, all of which constitute one active region.

The transistor 22 has the LDD structure and the salicide structure similarly to the transistor 21. In the transistor 22, a silicide layer 38A is on the gate electrode 35, and a silicide layer 38B is on the source and drain regions 37. In the 2-input NAND circuit, the source region 37 and the body region 32 of the transistor 22 are electrically connected via the first wiring 41S and the body contact region (n-type semiconductor region) 33C, so that the source region 37 and the body region 33 have the same potential.

The first wiring 41S of the transistor 22 extends from the source region 37 along the gate width of the transistor 22, and is bent in the shape of L toward the body contact region 33C along the gate length. The drain regions 37 of the transistors 21 and 22 are integral, and the source regions 37 of these transistors 21 and 22 are arranged along the gate length with the drain regions 37 of these transistors 21 and 22 positioned at the center. As a result, the first wirings 41S of these transistors 21 and 22 can be made integral, and be in the shape of C (or U).

On the transistors 21 and 22, the second wiring 43 on the first wiring 41 and 41S (in the shaped of C) is used to provide a second power wiring (Vcc). The line width of the second power wiring is a degree equal to the gate width of the transistors 21 and 22, and extends along the gate length.

The foregoing semiconductor integrated circuit can adopt the base 30 which has the SOI structure and is difficult to supply potentials to the body regions 32 of the transistors 11 and 12 and to the body regions 33 of the transistors 21 and 22. Further, the source region 36 of at least the transistor 12 near the output terminal 5 is electrically connected to the body region 32, and the potential of the body region 32 is maintained to be equal to the potential of the source region 36. Therefore, it is possible not only to suppress the substrate bias effect but also to prevent the increase of the threshold voltage due to the body effect. Further, it is possible to improve the current-activated performance of the transistor 12 and to accelerate the operation of the transistor 12 and the semiconductor integrated circuit. The base 30 made of the SOI substrate can reduce the parasitic capacity and power consumption of the semiconductor integrated circuit and extensively accelerate the operation of the semiconductor integrated circuit.

In the foregoing semiconductor integrated circuit, the body contact regions 32C are positioned along the gate width of the transistors 11 and 12, and the body contact regions 33C are positioned along the gate width of the transistors 21 and 22. Therefore, the body region 32 of the transistors 11 and 12 can be easily connected to the source region 36 via a shortest route. This also holds true to the connection of the body region 33 to the source region 37 of the transistors 21 and 22.

Further, the body contact regions 32C of the transistors 11 and 12 are positioned opposite to the transistors 21 and 22 while the body contact regions 33C of the transistors 21 and 22 are positioned opposite to the transistors 11 and 12. Therefore, the body regions 32 of the transistors 11 and 12 can be easily connected to the source regions 36 via the shortest routes regardless of the layout of the first wirings 41

(wiring in the cell) of the transistors 11, 12, 21 and 22. This also holds true to the connection of the body regions 33 and the source regions 37 of the transistors 21 and 22.

Still further, the element isolating insulator 31 surrounds the transistors 11 and 12 and the body contact regions 32C as one active region, and also surrounds the transistors 21 and 22 and the body contract regions 33C as another one active region. Therefore, the transistors 11 and 12 can be isolated from the body contact regions 32C without any space therebetween. This also holds true to the transistors 21 and 22 and the body contact regions 33C. The semiconductor integrated circuit can have a high integration degree.

The body contact region 32C, the source and drain regions of the transistors 11 and 12, the source and drain regions of the transistors 21 and 22, and the body contact regions 33C, which are positioned from the left to the right in FIG. 7, have the conduction types p, n, p and n. P-type impurities are doped into a region defined by a broken line 32P, thereby forming the body contact regions 32C while n-type impurities are doped into a region defined by another broken line 36N in order to form the source and drain regions 36 of the transistors 11 and 12. Additionally, p-type impurities are doped into a region defined by a broken line 37P in order to form the source and drain regions 37 of the transistors 21 and 22. N-type impurities are doped into a region defined by a further broken line 33N in order to from the body contact regions 33C. Contours of the regions defined by the broken lines 32P, 36N, 37P and 33N are identical to the shape of manufacturing masks, which is effective in easily doping the impurities having different conduction types in a manufacturing process to be described later.

The base 30 is not always the SOI substrate, but may be the SOS substrate which is constituted by a silicon single crystal layer, a polycrystalline silicon layer, an III-V group chemical compound semiconductor layer or the like. In other words, the semiconductor integrated circuit may have the SOS structure.

[Method of Manufacturing Semiconductor Integrated Circuit]

Figure 8:
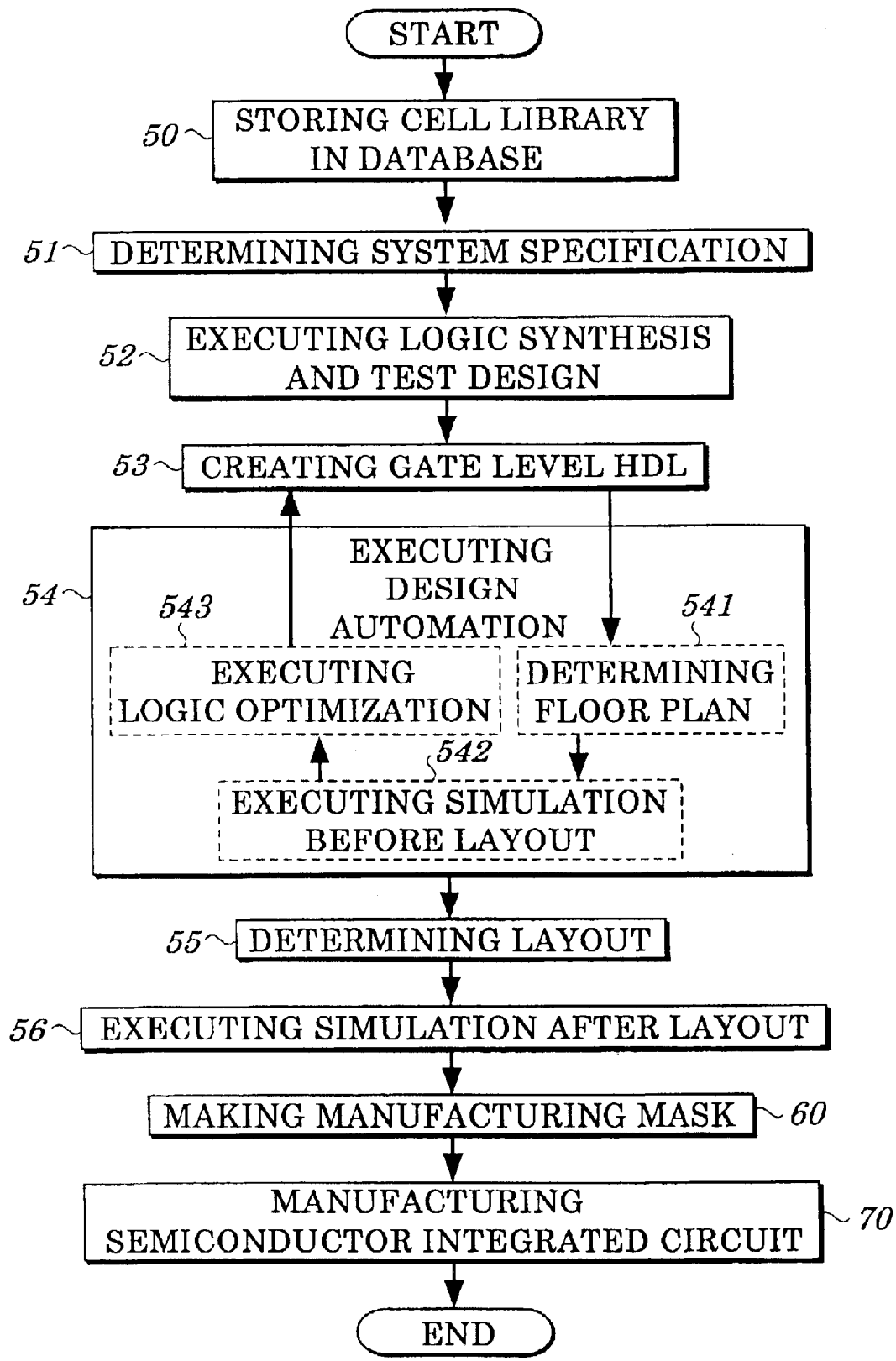
FIG. 8 is a flowchart showing the overall process for manufacturing the semiconductor integrated circuit.
Figure 9:
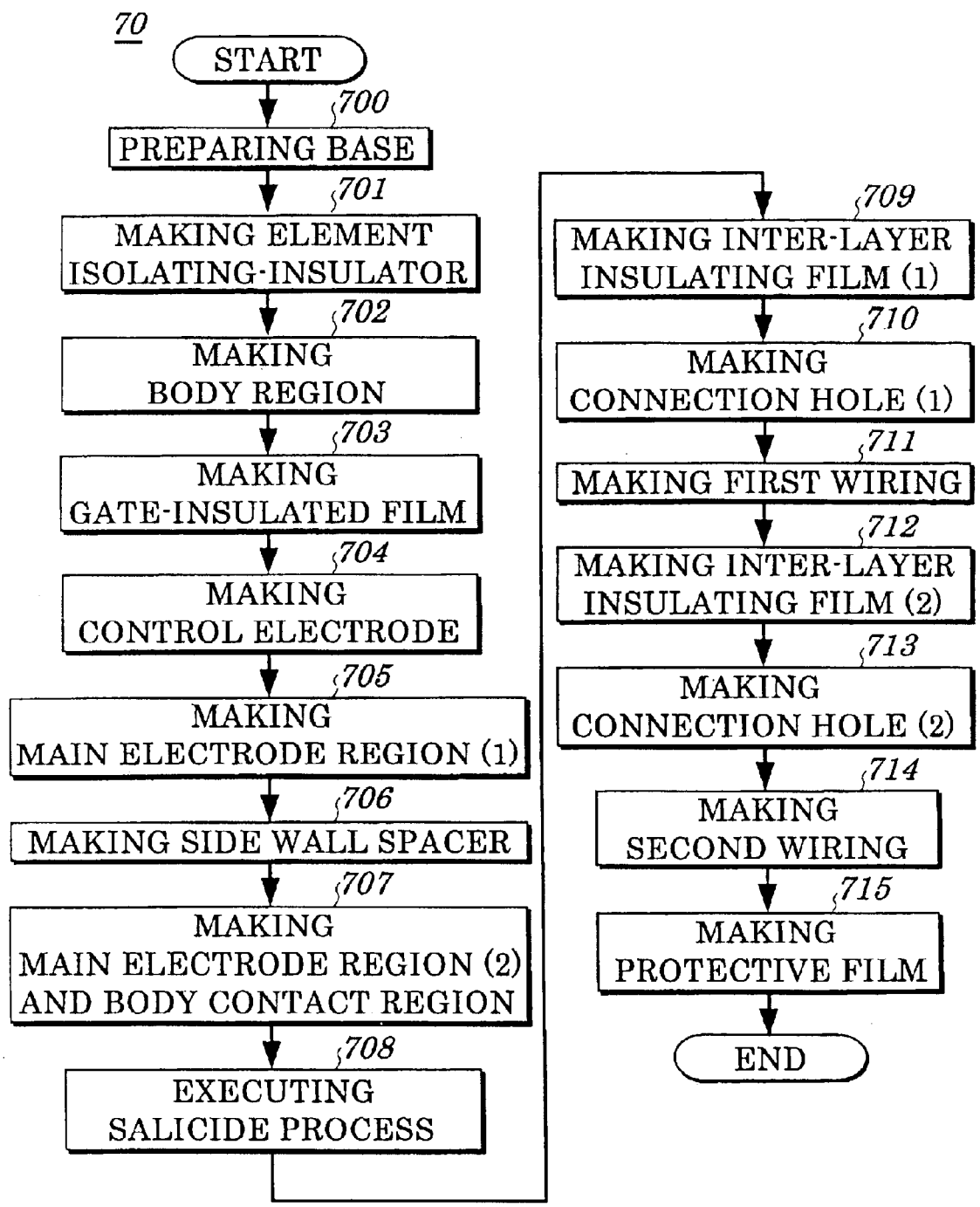
FIG. 9 is a flowchart showing the process for manufacturing the essential parts of the semiconductor integrated circuit.

The semiconductor integrated circuit will be manufactured by the process shown in the flowcharts of FIG. 8 and FIG. 9. It is assumed here that the semiconductor integrated circuit includes the 2-input NAND circuit and is intended to be used as an ASIC (application specific integrated circuit). A design automation system and a computer are used for this purpose. In other words, the design automation system is used to configure the semiconductor integrated circuit manufacturing system and to form manufacturing masks.

Design Flow of Semiconductor Integrated Circuit for ASIC:

(1) Referring to FIG. 8, a cell library is stored in a database of the design automation system using the computer (step 50). The cell library contains data concerning the 2-input NAND circuit (shown in FIG. 1, FIG. 3 and FIG. 4 to FIG. 7) having the transistors 11 and 12 of the same channel conduction type and connected in series, and data indicating that at least the transistor 12 near the output terminal 5 has its body region 32 and source region 36 electrically connected in order to have the same potential. In other words, the cell library contains at least the data of components of the transistors 11, 12, 21 and 22 for constituting the 2-input NAND circuit, and wiring data for electrically connecting elements in the transistors. In other words, the component data are necessary for manufacturing at least the transistors 11, 12, 21 and 22 according to the layout as shown in FIG. 7. The wiring data include wiring patterns for manufacturing at least the first wirings 41 and 41S (including patterns of wirings which are flush with the gate electrode 35).

(2) A system specification of the semiconductor integrated circuit is determined (step 51). The system specification relates to specific items required by a customer, e.g. contents of the logic operation, a power supply voltage, power consumption, access time and so on.

(3) Logic synthesis and test design are executed on the basis of the system specification (step 52). The logic synthesis and test design create a gate level description on the basis of higher order design description using a logic synthesizing system.

(4) A gate level HDL process to create the logic at a gate level is executed on the basis of the gate level description (step 53).

(5) In the design automation system, the cell library is temporarily, physically, efficiently and automatically arranged on a virtual base (semiconductor integrated circuit) formed in a memory space on the basis of the gate level description (step 54). The cell library is automatically linked in accordance with an algorithm. An overall floor plan (i.e. layout) of the semiconductor integrated circuit is created (step 541).

The cell library already stored in the database is automatically placed, i.e. the cell library includes the data concerning the transistor 12 which has the same potential at the source region 36 and the body region 32. Then, it necessarily responds, this cell library is used.

(6) Timing of input/output logic signals and so on is simulated (simulation prior to layout) on the basis of the floor plan (step 542), thereby extracting a point for optimizing the logic circuit.

(7) The floor plan is reconstructed on the basis of the optimum point of the logic circuit in order to optimize the placement of the cell library, wiring patterns, and so on (step 543).

(8) A final layout of the logic circuit to be mounted in the semiconductor integrated circuit is executed on the basis of the optimized and reconstructed floor plan (step 55).

(9) Simulation after the layout is executed in order to check whether or not the logic circuit complies with the system specification (step 56).

In the design flow of the semiconductor integrated circuit, the database stores the cell library indicating that the source region 36 and the body region 32 of at least the transistor 12 near the output terminal 5 are maintained to have the same potential. The cell library is arranged by the design automation system. Therefore, it is possible to design the logic circuit, arrange the cell library by the design automation system, connect components and so on regardless of the increase of the threshold voltage due to the body effect, in order to manufacture the semiconductor integrated circuit. It is also possible to improve the cell library data concerning the current-activated performance of the transistor 12 near the output terminal 5, and easily manufacture the semiconductor integrated circuit having a reduced power consumption. Further, the operations of the transistor 12 and the semiconductor integrated circuit can be accelerated.

Making Manufacturing Masks:

Manufacturing masks (reticles or master masks) are made on the basis of finally verified logic circuit data (step 60). The manufacturing masks are formed by mask blanks with a shielding film (e.g. a chromium film) on a quartz glass substrate, and by depicting element patterns, wiring patterns or the like on the shielding film using an electron beam patterning system. A plurality of manufacturing masks are prepared in order to form the element isolating insulator 31, body regions 32 and 33, gate electrode 35, source and drain regions 36, source and drain regions 37, connection hole 46H, first wiring 41 and 41S, connection hole 42H, and second wiring 43, respectively.

Referring to FIG. 3, the transistors 11 and 12 have the LDD structure, so that two manufacturing masks are prepared in order to form the source and drain regions 36 (n-type semiconductor region). Further, two manufacturing masks are prepared in order to form the source and drain regions 37 (p-type semiconductor region) of the transistors 21 and 22. If the LDD structure is not adopted, one manufacturing mask each is prepared for the source and drain regions 36 and 37, respectively.

The manufacturing masks for the body contact region 32C (p-type semiconductor region) of the transistors 11 and 12 shown in FIG. 4, FIG. 6 and FIG. 7 are also used in order to form the source and drain regions 37 (p-type semiconductor region) of the transistors 21 and 22. Further, the manufacturing masks for the body contact region 33C (n-type semiconductor region) of the transistors 21 and 22 are also used in order to form the source and drain regions 36 (n-type semiconductor region) of the transistors 11 and 12 shown in FIG. 5 to FIG. 7.

The manufacturing mask for forming the first wiring 41 (shown in FIG. 6) is also used to form the first wiring 41S which connects the source region 36 and the body contact region 32C, and the source region 37 and the body contact region 33C.

Semiconductor Integrated Circuit Manufacturing Process:

The semiconductor integrated circuit is manufactured using the manufacturing masks in the process shown in FIG. 8 and FIG. 9.

(10) First of all, the base 30 is prepared (step 700). The base 30 is made of the SOI substrate including the silicon single crystal substrate 30A provided with the silicon single crystal layer 30C via the insulator 30B (refer to FIG. 3 to FIG. 7).

(11) The first manufacturing mask is used to form element isolating insulators 31 on the silicon single crystal layer 30C between elements of the transistors 11, 12, 21 and 22 (step 701). In this embodiment, a pattern of the first manufacturing mask is transferred (i.e. exposed) actually onto a photo-resist film which is applied by the photolithography technology on the silicon single crystal layer 30C. Then, this photo-resist film is developed, and the photo-resist mask is formed. Using this photo-resist mask, predetermined processing such as the thermal oxidation process, the etching process, the ion implantation process and so on is carried out. This process is also applicable to a second and succeeding manufacturing masks.

(12) The second manufacturing mask is used to from the body region 32 in the silicon single crystal layer 30C at the area for the transistors 11 and 12. Further, the third manufacturing mask is used to from the body region 33 at the area for the transistors 21 and 22 (step 702). Impurities having the predetermined channel conduction type are doped into the body regions 32 and 33 by ion implantation, for example.

(13) The gate-insulated film 34 is formed on the body regions 32 and 33 by the thermal oxidation process, for instance (step 703).

(14) A polycrystalline silicon film is formed on the gate-insulated film 34, and is patterned (i.e. etched) using the fourth manufacturing mask, thereby forming the gate electrode 35 (step 704). The polycrystalline silicon film is formed by the CVD (chemical vapor deposition) process, for instance, and is doped by impurities having the predetermined conduction types in order to reduce resistance. The impurities are doped to deposition or after deposition of the polycrystalline silicon film.

(15) The fifth manufacturing mask is used to form n-type semiconductor regions of the source and drain regions 36 at the area for the transistors 11 and 12 in the silicon single crystal layer 30C (step 705). The n-type semiconductor regions have a low impurity concentration. Specifically, the n-type semiconductor regions are formed by doping n-type impurities, implanting ions, using a mask formed by the fifth manufacturing mask and the gate electrode 35 of the transistors 11 and 12 as an impurity doping mask. Thereafter, the sixth manufacturing mask is used to form p-type semiconductor regions of the source and drain regions 37 at the area for forming the transistors 21 and 22 in the silicon single crystal layer 30C. The p-type semiconductor regions have a low impurity concentration. Specifically, the p-type semiconductor regions are formed by doping p-type impurities, implanting ions, using a mask formed by the sixth manufacturing mask and the gate electrode 35 of the transistors 21 and 22 as an impurity doping mask.

(16) Side wall spacers are made at the sides of the gate electrode 35 of the transistors 11, 12, 21 and 22, respectively (step 706). For this purpose, a silicon nitride film is formed over the base 30 by the CVD process or sputtering process, and is etched by an anisotropic etching process such as the RIE (reactive ion etching) process in the deposited film thickness minute, so that the side wall spacers are formed only at the sides of the gate electrode 35 where the silicon nitride film is present.

(17) N-type semiconductor regions having the high impurity concentration and used for the source and drain regions 36 are formed, using the seventh manufacturing mask, in the silicon single crystal layer 30C where the transistors 11 and 12 are to be formed (step 707). Specifically, the n-type semiconductor regions are formed by doping n-type impurities, implanting ions and using a mask 601 made of the seventh manufacturing mask, gate electrode 35 of the transistors 11 and 12 and side wall spacers as an impurity doping mask. When the n-type semiconductor regions are completed, the source and drain regions 36 are completed, i.e. the transistors 11 and 12 are also completed. The source and drain regions 36 are self-aligned with respect to the gate electrode 35.

Figure 10:
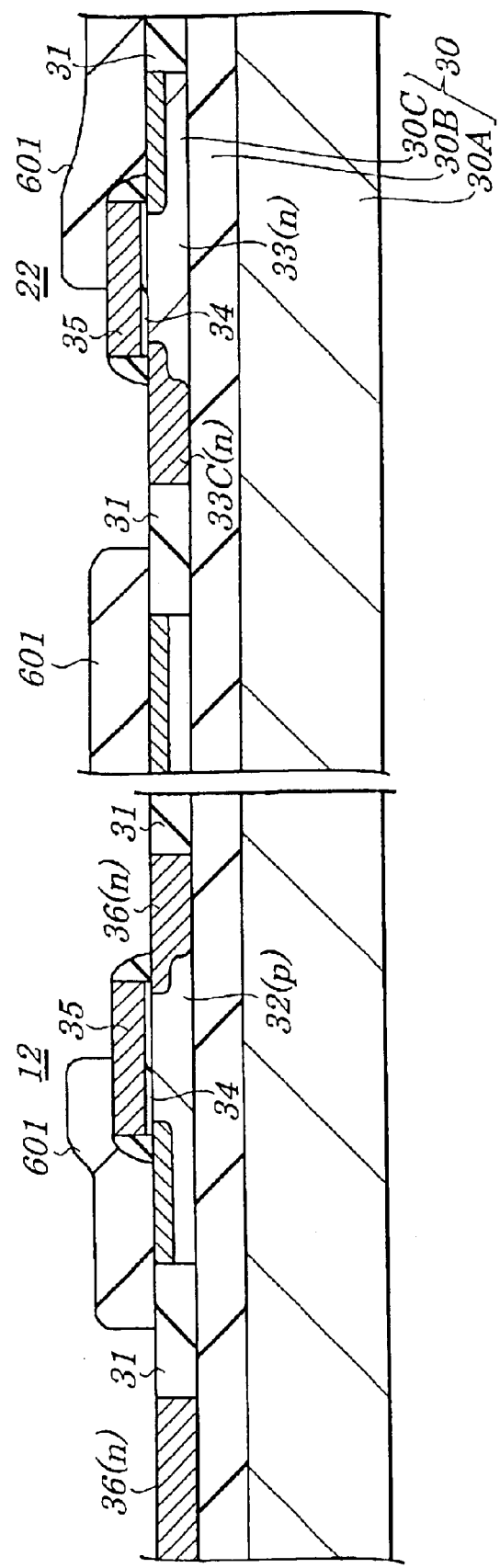
FIGS. 10 to 12 show how the essential parts of the semiconductor integrated circuit are being manufactured.

The body contact regions 33C of the transistors 21 and 22 are formed by a manufacturing process identical to that for the n-type semiconductor region, as shown in FIG. 10.

P-type semiconductor regions having the high impurity concentration and used for the source and drain regions 37 are formed, using the eighth manufacturing mask, in the silicon single crystal layer 30C where the transistors 21 and 22 are to be formed (step 707). Specifically, the p-type semiconductor regions are formed by doping p-type impurities, implanting ions and using a mask 602 made of the seventh manufacturing mask, gate electrode 35 of the transistors 21 and 22 and side wall spacers as an impurity doping mask. When the p-type semiconductor regions are completed, the source and drain regions 37 are completed, i.e. the transistors 21 and 22 are also completed. The source and drain regions 37 are self-aligned with respect to the gate electrode 35.

Figure 11:
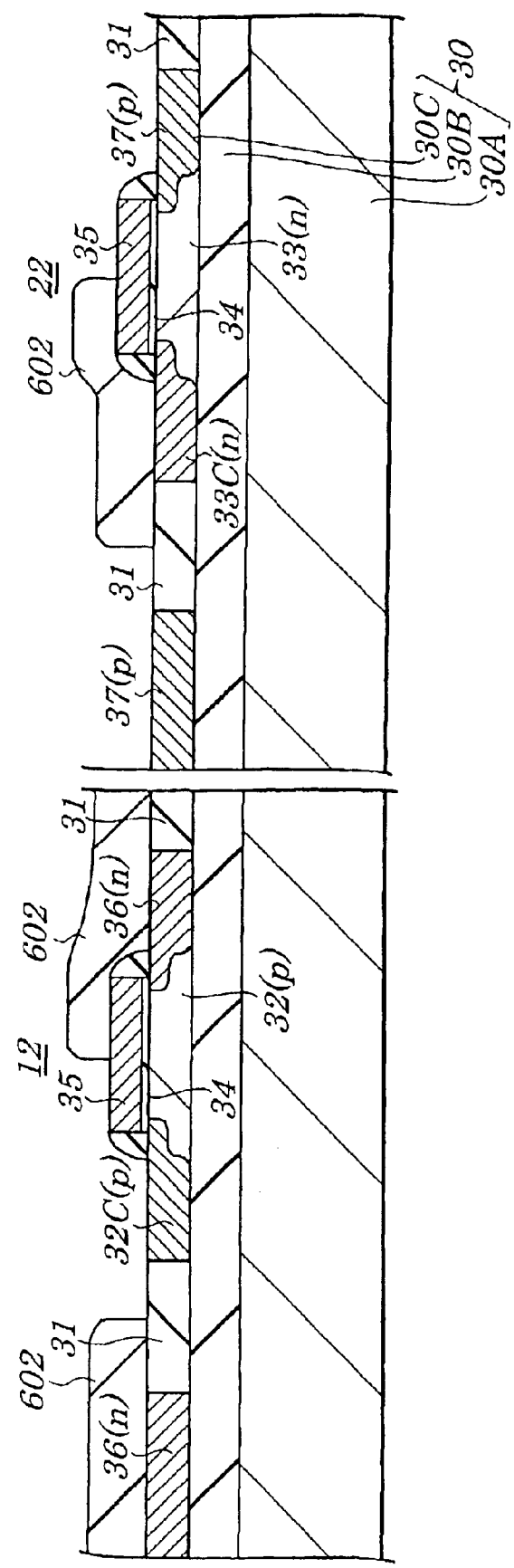

The body contact regions 32C of the transistors 11 and 12 are formed by the same manufacturing process as that for the p-type semiconductor region, as shown in FIG. 11.

The body contact regions 33C of the transistors 21 and 22 can be formed by the same manufacturing process as that of the source and drain regions 36 of the transistors 11 and 12. Further, the body contact regions 32C of the transistors 11 and 12 can be formed by the same manufacturing process as that for the source and drain regions 37 of the transistors 21 and 22.

(18) The salicide layer 38A is formed on the gate electrodes 35 of the transistors 11, 12, 21 and 22, by the salicide process (step 708). Further, the salicide layer 38B is formed on the source and drain regions 36 of the transistors 11 and 12, and on the source and drain regions 37 of the transistors 21 and 22, by the same manufacturing process as that of the salicide layer 38A.

(19) The inter-layer insulator film 40 is formed over the base 30 in order to cover the transistors 11, 12, 21 and 22 (step 709).

(20) The connection holes 40H are made in the source and drain regions 36 of the transistor 11 and 12, and in the source and drain regions 37 of the transistors 21 and 22 (step 710). Specifically, the connection holes 40H are made by the anisotropic etching such as RIE and by using the ninth manufacturing mask.

(21) The first wiring 41 is formed on the inter-layer insulator film 40 (step 711). The first wiring 41 is made by forming an aluminum alloy film on the inter-layer insulator film 40 by the sputtering process, and by patterning the aluminum alloy film using the tenth manufacturing mask. The first wiring 41 is connected via the connection holes 40H to the source and drain regions 36 and the gate electrode 35 of the transistors 11 and 12, and to the source and drain regions 37 and the gate electrode 35 of the transistors 21 and 22.

Figure 12:
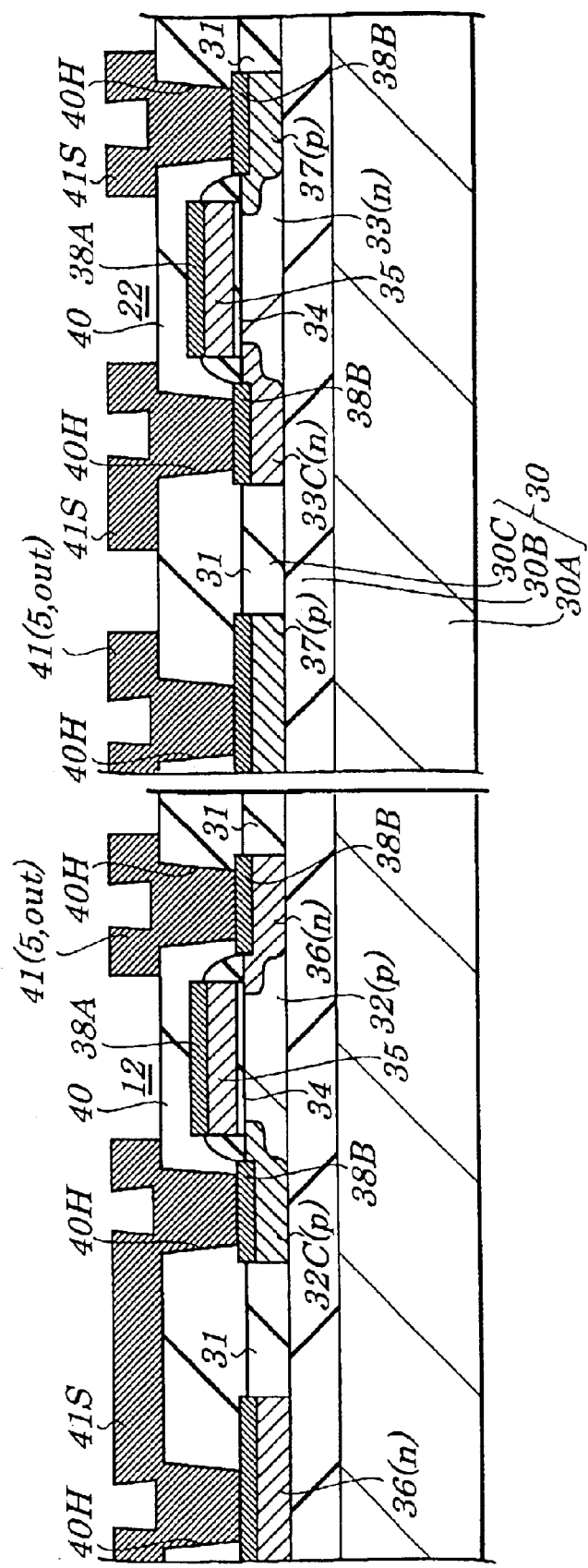

As shown in FIG. 12, the source regions 36 of the transistors 11 and 12 are connected to the body contact region 32C by the same manufacturing process as that of the first wiring 41S, in order to have the same potential. Further, the first wiring 41S is formed in order to connect the source regions 37 of the transistors 21 and 22 and the body contact region 33C, so that they have the same potential. In other words, the first wiring 41S is made using the tenth manufacturing mask similarly to the first wiring 41, and is positioned on the same conductive layer and is made of the same conductive material.

In the foregoing design flow, the cell library stored in the database includes at least the data for forming the transistors 11, 12, 21 and 22, and the wiring data of the first wirings 41 and 41S.

The source region 36 of at least the transistor 12 near the output terminal 5 or the second power supply terminal 2 and the body region 32 are electrically connected by the wiring process for connecting the transistors 11 and 12 (and 21 and 22) in series. Therefore, it is possible to reduce the manufacturing steps.

(22) The inter-layer insulator film 42 is formed over the base 30 in order to cover the first wirings 41 and 41S (step 712).

(23) The connection holes 42H are made in the inter-layer insulator film 42 at predetermined positions of the first wiring 41 (step 713), by the anisotropic etching process such as RIE and using the eleventh manufacturing mask.

(24) The second wiring 43 is made on the inter-layer insulator film 42 (step 714), by forming an aluminum alloy film by the sputtering process, and by patterning the aluminum alloy film using the twelfth manufacturing mask. The second wiring 43 is connected to the first wiring 41 via the connection hole 42H.

(25) Although not shown in FIG. 3, a protective film extends all over the base 30 including the second wiring 43. In this state, the semiconductor integrated circuit is completed.

(Modified Example of First Embodiment)

In a modified example of the first embodiment, the multi-input logic circuit to be mounted in the semiconductor integrated is applied as a 3-input NAND circuit.

[Configuration of 3-Input NAND Circuit]

Figure 13:
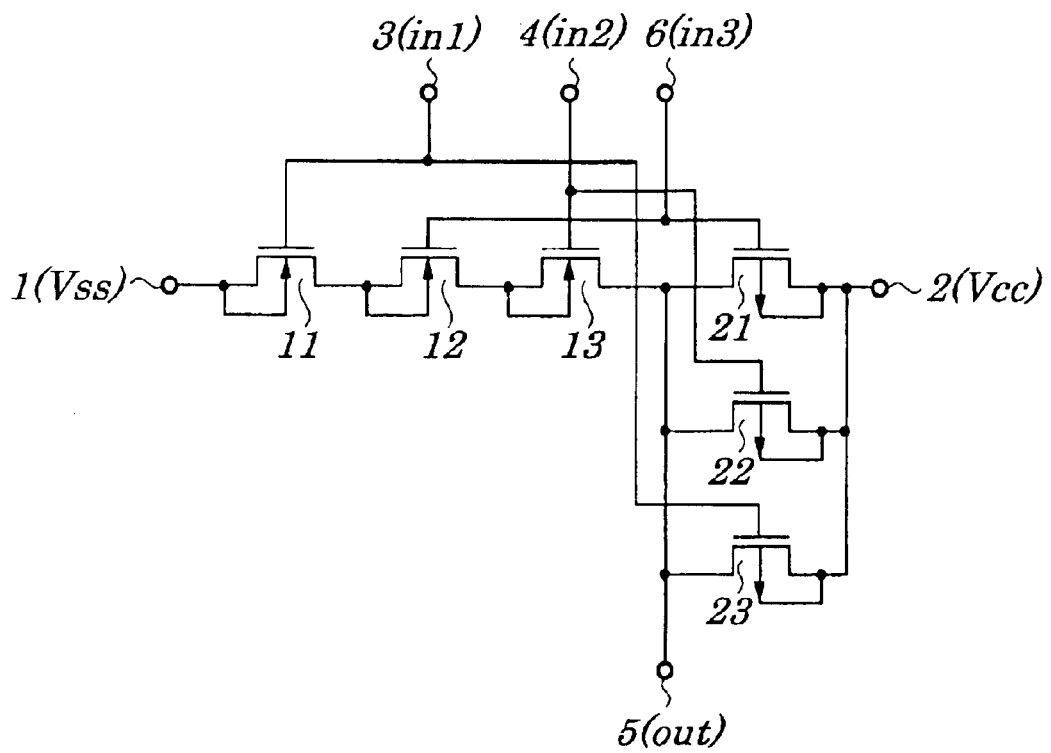
FIG. 13 shows a 3-input NAND circuit used in a modification of the semiconductor integrated circuit of the first embodiment.

Referring to FIG. 13, the 3-input NAND circuit comprises at least: transistors 11, 12 and 13 having the same channel conduction type and connected in series between a first power supply terminal 1 (Vss) and an output terminal 5 (out); and transistors 21, 22 and 23 electrically connected in parallel between a second power supply terminal 2 (Vcc) and the output terminal 5. Source regions and body regions of at least the transistors 12 and 13 near the output terminal 5 are electrically connected in order to have the same potential.

The transistors 11, 12 and 13 are constituted by n-channel IGFETs. The transistor 11 has its source region electrically connected to the first power supply terminal 1, and its drain region electrically connected to the source region of the transistor 12. The gate electrode of the transistor 11 is electrically connected to the first input terminal 3 (in1). The transistor 12 has its drain region electrically connected to the source region of the transistor 13, and its gate electrode connected to third input terminal 6 (in3). The transistor 13 has its drain region electrically connected to the output terminal 5, and its gate electrode electrically connected to second input terminal 2 (in2).

The transistors 21, 22 and 23 are constituted by p-channel IGFETs. The transistor 21 has its source region electrically connected to the second power supply terminal 2 (Vcc), and its drain region electrically connected to the output terminal 5 (and the drain region of the transistor 13). The gate electrode of the transistor 21 is electrically connected to the third input terminal 6. The transistor 22 has its source region electrically connected to the second power supply terminal 2, and its drain region electrically connected to the output terminal 5 (and the drain region of the transistor 13). The gate electrode of the transistor 22 is electrically connected to the second input terminal 4. The transistor 23 has its source region electrically connected to the second power supply terminal 2, its drain region electrically connected to the output terminal 5 (and the drain region of the transistor 13), and its gate electrode electrically connected to the first input terminal 3.

The source regions and body regions of at least the transistors 12 and 13 near the output terminal 5 are connected in order to have the same potential (shorted). Further, in the modified example, the source regions and body regions of the transistors 11, 21, 22 and 23 are electrically connected in order to have the same potential. In other words, the source regions and the body regions are electrically connected via parasitic resistors, schottky junctions or the like, which are indispensable, but without via resistance elements, diode elements or the like.

In the first embodiment, the source regions and the body regions of at least the transistors 12 and 13 near the output terminals 5 are electrically connected in order to have the same potential. Therefore, it is possible to suppress the substrate bias effect and to prevent the increase of the threshold voltage due to the body effect. Specifically, the current-activated performance of the final transistor 13 can be improved, and the operation of the semiconductor integrated circuit can be accelerated.

(Second Embodiment of the Invention)

In a second embodiment, the multi-input logic circuit of the semiconductor integrated circuit is applied as a 2-input NOR circuit.

[Circuit Configuration of 2-Input NOR Circuit]

Figure 14:
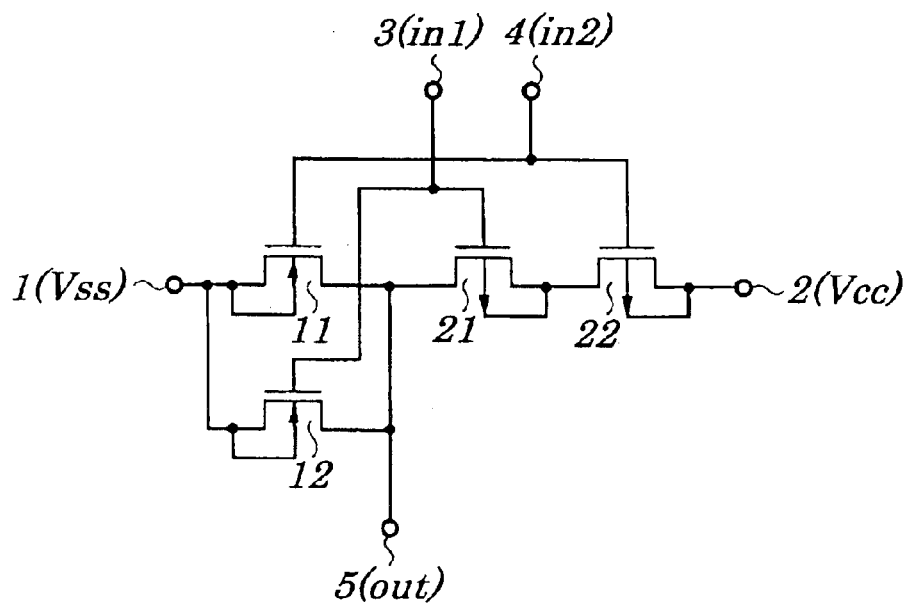
FIG. 14 shows a 2-input NOR circuit mounted in a semiconductor integrated circuit according to a second embodiment of the invention.

The 2-input NOR circuit is configured as shown in FIG. 14, and comprises transistors 11 and 12 having the same channel conduction type and electrically connected in parallel between a first power supply terminal 1 (Vss) and an output terminal 5 (out), and transistors 21 and 22 having the same channel conduction type and electrically connected in series between a second power supply terminal 2 (Vcc) and the output terminal 5. Further, a source region and a body region of at least the transistor 21 near the output terminal 5 are electrically connected in order to have the same potential.

The first power supply terminal 1 is used to provide a circuit grounding potential Vss, e.g. 0 V, while the second power supply terminal 2 is used provide a circuit operating potential Vcc, e.g. 1.0 V to 3.3 V.

The transistors 11 and 12 are constituted by n-channel IGFETs. The transistor 11 has its source region electrically connected to the first power supply terminal 1, and its drain region electrically connected to the output terminal 5. The gate electrode of the transistor 11 is electrically connected to the second input terminal 4 (in2). The transistor 12 has its source region electrically connected to the first power supply terminal 1, and its drain region electrically connected to the output terminal 5. The gate electrode of the transistor 12 is connected to first input terminal 3 (in1).

The transistors 21 and 22 are constituted by p-channel IGFETs. The transistor 22 has its source region electrically connected to the second power supply terminal 2, and its drain region electrically connected to the source region of the transistor 21. The gate electrode of the transistor 22 is electrically connected to the second input terminal 4. The transistor 21 has its drain region electrically connected to the output terminal 5 (and the drain regions of the transistors 11 and 12). The gate electrode of the transistor 21 is electrically connected to the first input terminal 3.

The source regions and body regions of at least the transistor 21 are connected in order to have the same potential (shorted). Further, in the second embodiment, the source regions and body regions of the transistors 11, 12 and 22 are electrically connected in order to have the same potential. In other words, the source regions and the body regions are electrically connected via parasitic resistors, schottky junctions or the like, which are indispensable, but without via resistance elements, diode elements or the like.

In the second embodiment, the source region and body region of at least the transistor 21 near the output terminal 5 are electrically connected in order to have the same potential, so that the potential of the body region is maintained to be the same as that of the source region, as in the 2-input NAND circuit of the first embodiment and in the 3-input NAND circuit in the modified example of the first embodiment. Therefore, it is possible to suppress the substrate bias effect and prevent the increase of the threshold voltage due to the body effect. In other words, it is possible to lower the threshold voltage Vth of the transistor 21 near the output terminal 5 to the preset value and to increase the drain current Id with respect to the gate voltage Vg. This is effective in improving the current-activated performance of the transistor 21 and in reducing the power consumption of the semiconductor integrated circuit. Further, it is possible to accelerate the operation of the transistor 21 and the semiconductor integrated circuit.

According to this embodiment, the 2-input NOR circuit is constituted by the transistors 11, 12, 21 and 22, and has the improved current-activated performance, which enables high speed operation of the semiconductor integrated circuit.

[Device Structure of 2-Input NOR Circuit]

Figure 15:
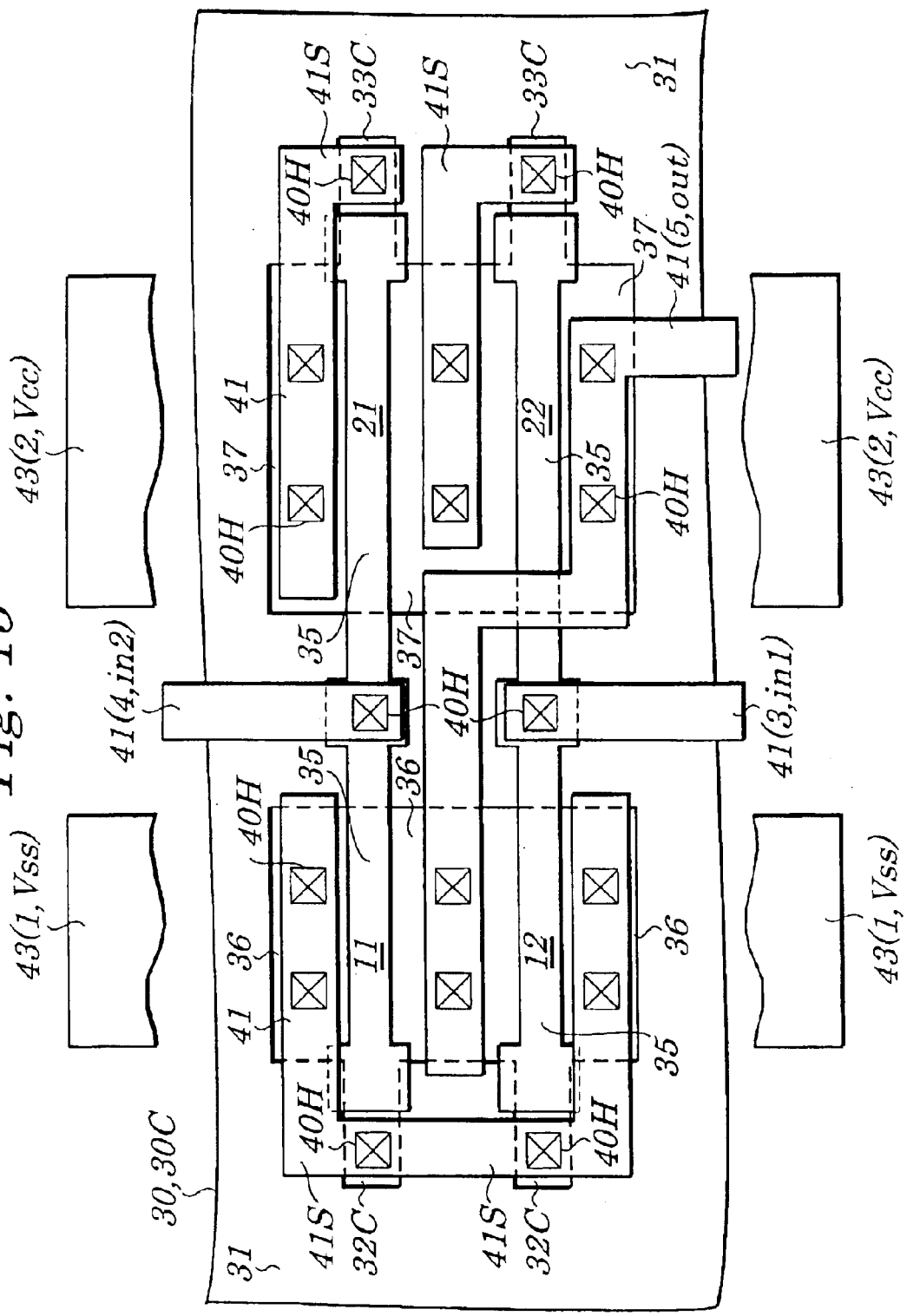
FIG. 15 is a top plan view of the semiconductor integrated circuit according to a second embodiment of the invention.
Figure 16:
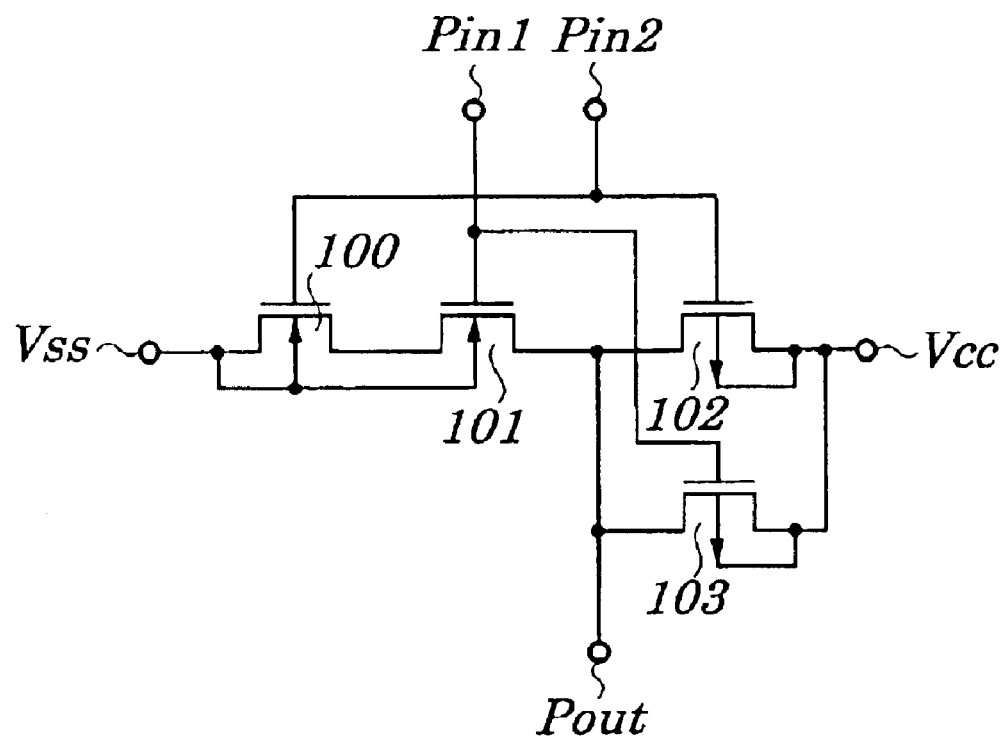
FIG. 16 shows a 2-input NAND circuit of the related art.

The 2-input NOR circuit is structured as shown in FIG. 15. First wirings 41 and 41S are fundamentally identical to those of the 2-input NAND circuit of the first embodiment except for wiring patterns, and will not be described here. The first wirings 41S are used to electrically connect the source region 37 of at least the transistor 21 near the output terminal 5 and the body contact region 33C.

(Other Embodiments of the Invention)

In the foregoing embodiment, the semiconductor integrated circuit includes the IGFETs made of the silicon single crystal layer 30C. Alternatively, if the semiconductor integrated circuit is constituted by the III-V group compound semiconductor layer such as gallium (Ga)-arsenic (As), the transistors 11, 12, 13, 21,22 and 23 will be MESFETs (metal shottky field effect transistors).

With the first embodiment, the 2-wiring layer structure in which the first and second wirings 41 and 43 are used is described. Needless to say, the present invention is applicable to three or more wiring layer structures.

The foregoing semiconductor integrated circuit comprises the multi-input logic circuit constituted by the n-channel conduction type transistors 11 and 12 (and 13) and the p-channel conduction type transistors 21 and 22 (and 23). Alternatively, the invention is applicable to a multi-input logic circuit in which a plurality of transistors having the same channel conduction type are electrically connected in series between the first and second power supply terminals 1 (Vss) and 2 (Vcc). Fundamentally, the source regions and body regions of transistors which may cause the substrate bias effect should be electrically connected in order to have the same potential. For instance, in the case of n-channel conductive type transistors, source regions and body regions of at least the transistors near the second power supply terminal 2 should be electrically connected in order to have the same potential. In the case of p-channel conductive type transistors, source regions and body regions of at least the transistors near the first power supply terminal 2 should be electrically connected in order to have the same potential.

The semiconductor integrated circuit including the multi-input logic circuit has been described. The invention is also applicable to semiconductor integrated circuit in which a central processing unit (CPU), a micro processing unit (MPU), a static random access memory (SRAM), a dynamic random access memory (DRAM) or the like includes a multi-input logic circuit. Especially, in the SRAM, the invention is applicable to a multi-input logic circuit in a peripheral circuit. Further, in a high speed DRAM, the invention is applicable to a multi-input logic circuit in a peripheral circuit.

Although the present invention has been described and illustrated in detail, it is to be clearly understood that the same is by way of illustration and example only, and is not to be taken by way of limitation. The spirit and scope of the present invention are to be limited only by the terms of the appended claims.

As described so far, the invention provides the semiconductor integrated circuit which can suppress the substrate bias effect of the transistors, prevent the increase of the threshold voltage due to the body effect, and accelerate the operation.

The invention provides the semiconductor integrated circuit which can accelerate the overall circuit operation by preventing the threshold voltage from being increased by the body effect.

Further, the invention provides the semiconductor integrated circuit which assures the foregoing advantages and includes the multi-input logic circuit.

Still further, the invention provides the semiconductor integrated circuit which includes complementary voltage-activated transistors, and has the foregoing advantages.

Finally, the invention provides the method of manufacturing the semiconductor integrated circuit which can reduce the number of manufacturing steps.

What is claimed is:

1. A method of manufacturing a semiconductor integrated circuit comprising:

storing a cell library in a database, said cell library containing data of at least a plurality of first voltage-activated transistors having the same channel conduction type, electrically connected in parallel or in series between a first power supply terminal and an output terminal, and a body region and a source region of at least one first voltage-activated transistor near said output terminal are electrically connected and have the same potential, and a plurality of second voltage-activated transistors having the same channel conduction type, electrically connected in series or in parallel to a second power supply terminal and said output terminal, and a body region and a source region of at least one second voltage-activated transistor near said output terminal are electrically connected and have the same potential;

designing a logic circuit;

locating said cell library from said database to a memory space on the basis of said logic circuit by using a design automation system; and linking said cell library in said memory space using said design automation system and creating logic circuit data.

2. A method of manufacturing a semiconductor integrated circuit comprising:

storing a cell library in a database, said cell library containing data of at least first and second voltage-activated transistors having the same channel conduction type, electrically connected in series between a first power supply terminal and a second power supply terminal of which potential is higher than that of said first power supply terminal, a body region and a source region of at least one first or second voltage-activated transistor near said second power supply terminal are electrically connected and have the same potential;

designing a logic circuit;

locating said cell library from said database to a memory space on the basis of said logic circuit by using a design automation system; and linking said cell library in said memory space using said design automation system and creating logic circuit data.

\* \* \* \* \*